(12) United States Patent
Chianghsieh et al.

(10) Patent No.: US 12,408,288 B2
(45) Date of Patent: Sep. 2, 2025

(54) RISER CAGE HALF TURN FASTENER

(71) Applicant: HEWLETT PACKARD ENTERPRISE DEVELOPMENT LP, Spring, TX (US)

(72) Inventors: Peng Chianghsieh, Taoyuan (TW); Chen-Ruei Tu, New Taipei (TW); Chi-Ting Yang, New Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 174 days.

(21) Appl. No.: 18/489,257

(22) Filed: Oct. 18, 2023

(65) Prior Publication Data

US 2025/0133679 A1   Apr. 24, 2025

(51) Int. Cl.
F16B 21/09   (2006.01)
H05K 7/14   (2006.01)

(52) U.S. Cl.
CPC .......... H05K 7/1487 (2013.01); F16B 21/09 (2013.01)

(58) Field of Classification Search
None
See application file for complete search history.

(56) References Cited

U.S. PATENT DOCUMENTS

| | | | |
|---|---|---|---|
| 5,123,795 A | 6/1992 | Engel et al. | |
| 6,181,549 B1 * | 1/2001 | Mills | H05K 7/1489 292/228 |
| 6,579,029 B1 * | 6/2003 | Sevde | H05K 7/1414 403/321 |
| 9,098,252 B2 * | 8/2015 | Sauer | H05K 7/1429 |
| 9,609,778 B1 * | 3/2017 | Spencer | G06F 1/183 |
| 9,723,745 B2 * | 8/2017 | Qi | G06F 1/18 |
| 9,795,052 B2 * | 10/2017 | Hsiao | H05K 7/18 |
| 10,172,252 B1 * | 1/2019 | Chen | H05K 7/1487 |
| 10,499,527 B2 * | 12/2019 | Liao | H05K 7/1489 |
| 10,681,835 B2 * | 6/2020 | Moore | H05K 7/1492 |
| 11,506,237 B2 | 11/2022 | Wang | |
| D985,370 S | 5/2023 | Wang et al. | |

(Continued)

FOREIGN PATENT DOCUMENTS

CN   201605879 U   * 10/2010

OTHER PUBLICATIONS

Fivetech Technology Inc., "Latch Plunger," 2014.

(Continued)

*Primary Examiner* — Xanthia C Relford
(74) *Attorney, Agent, or Firm* — Jones Robb PLLC

(57) ABSTRACT

A riser cage of a computing device comprises a bracket, a riser card attached to the bracket, and a fastener attached to the bracket. The bracket is to support an expansion card. The riser card is to electrically connect the expansion card to the computing device. The fastener is to secure the riser cage to the computing device. The fastener comprises a handle, a shaft extending along a first axis, a pivot connecting the handle to the shaft, and a half-turn latch coupled to the shaft. The half-turn latch is configured to engage with a receptacle of the computing device to selectively secure the fastener to the receptacle. The handle is pivotable about the pivot between a deployed configuration and a stowed configuration, and in the stowed configuration the handle is parallel to the riser card.

20 Claims, 7 Drawing Sheets

(56) References Cited

U.S. PATENT DOCUMENTS

| | | | |
|---|---|---|---|
| 11,665,840 B1* | 5/2023 | O'Donnell | H05K 7/1409 |
| | | | 361/801 |
| 2013/0018505 A1* | 1/2013 | Barrett | A61G 12/001 |
| | | | 221/277 |
| 2013/0241377 A1* | 9/2013 | Zhang | G06F 1/181 |
| | | | 403/188 |
| 2013/0241378 A1* | 9/2013 | Zhang | H05K 5/0221 |
| | | | 403/327 |
| 2016/0150659 A1* | 5/2016 | Chen | E05B 65/46 |
| | | | 292/126 |
| 2017/0150634 A1* | 5/2017 | Huang | H05K 7/1489 |

OTHER PUBLICATIONS

Fivetech Technology Inc., "One Touch Plunger," 2016.
Fivetech Technology Inc., "Quarter Lock," 2016, retrieved online Jun. 8, 2023, http://www.fivetk.com/products/by-category/quarter-turn-lock/quarter-lock., 7 pages.
Southco, "Quick Access Fasteners," retrieved online Jun. 8, 2023, http://www.southco.com/en_us_int/fasteners/quick-access-fasteners.

* cited by examiner

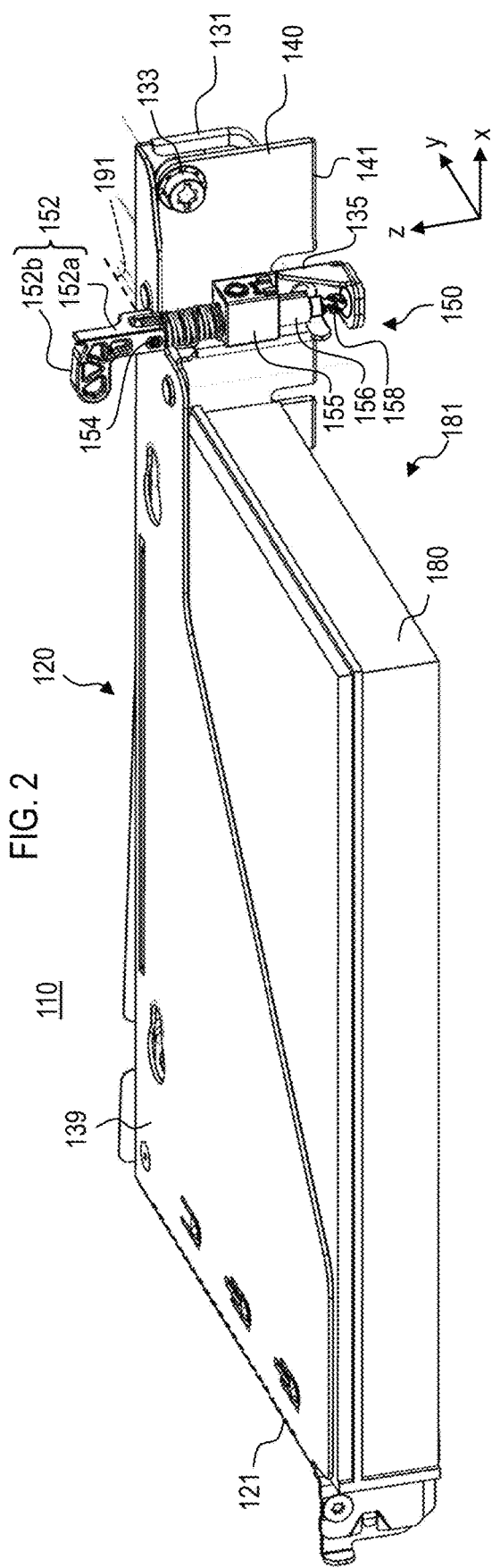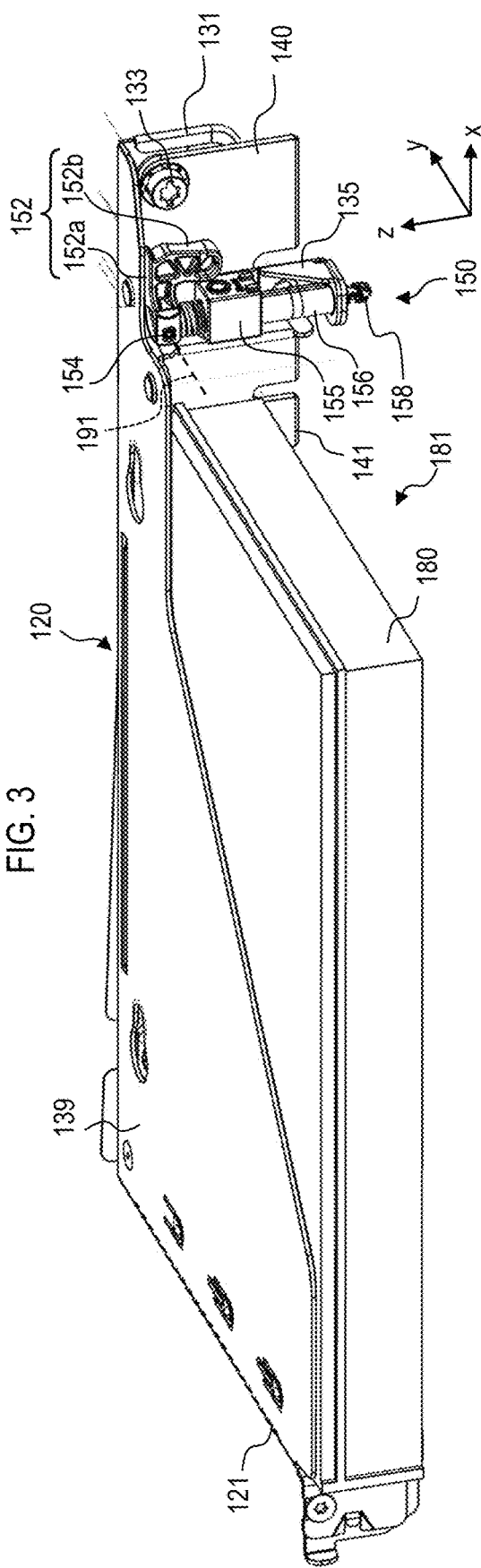

RISER CAGE HALF TURN FASTENER

INTRODUCTION

Computing devices, such as servers, generally have a primary system board (e.g., motherboard) which comprises a variety of components, such as power conversion circuitry, one or more CPU sockets to receive a processor, one or more memory sockets to receive memory devices, electrical and communications interconnects and busses, various controllers or chipsets (such as a baseboard management controller (BMC)), and others. In addition, to allow for more components to be added to the device, the primary system board may also include electrical connectors, which are configured to removably receive an electronic module. The addition of such modules generally expands the capability or functionality of the computing device, and thus the connectors and the modules have come to be known as expansion slots and expansion cards, respectively. Examples of such expansion slots include PCIe connectors, which come in different sizes and configurations (e.g., x16, x8, x1, etc.), M.2 connectors, and so on. Examples of common types of expansion cards include video cards or graphic processing units (GPUs), networking interface cards (NICs), storage controllers, hardware accelerators, and so on.

However, in some computing devices, it may not be possible to directly connect the expansion card to the expansion slot (e.g., due to orientation or space constraints), and thus the expansion card may be coupled to an intermediate board called a riser card, which is in turn connected to the expansion slot of the primary system board. The riser card is a printed circuit board assembly (PCA) which carries one electrical connector that is suitable for receiving the expansion card and another electrical connector suitable for being detachably connected to the expansion slot of the primary system board, and these connectors are arranged such that, when everything is connected, the expansion card fits as desired within the space constraints of the system.

For example, in some devices the expansion slots of the primary system board are oriented to receive expansion cards extending perpendicularly to the primary system board (a "vertical orientation"), but some computing devices (e.g., 1U or 2U servers) there may not be sufficient vertical clearance for an expansion card to have such a vertical orientation. However, the riser card may be much shorter than the expansion card, and thus the riser card can be connected to the expansion slot in the vertical orientation, and then the expansion card may be connected to the riser card in an orientation parallel to the primary system board (a "horizontal orientation"), thus allowing the expansion card to fit within the computing device. However, the electrical connections of the expansion slot and the riser card are generally not robust enough to physically support and secure the riser card and expansion card. Thus, riser cards and expansion cards are generally deployed with a supporting structure to support and secure them to the chassis and/or system board. This supporting structure is referred to as a riser cage.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings:

FIG. 2 is a perspective view of an example riser cage assembly with a half-turn fastener in an unfastened state.

FIG. 3 is another perspective view of the example riser cage assembly of FIG. 2 with the half-turn fastener in a fastened state.

DETAILED DESCRIPTION

Figure 1:
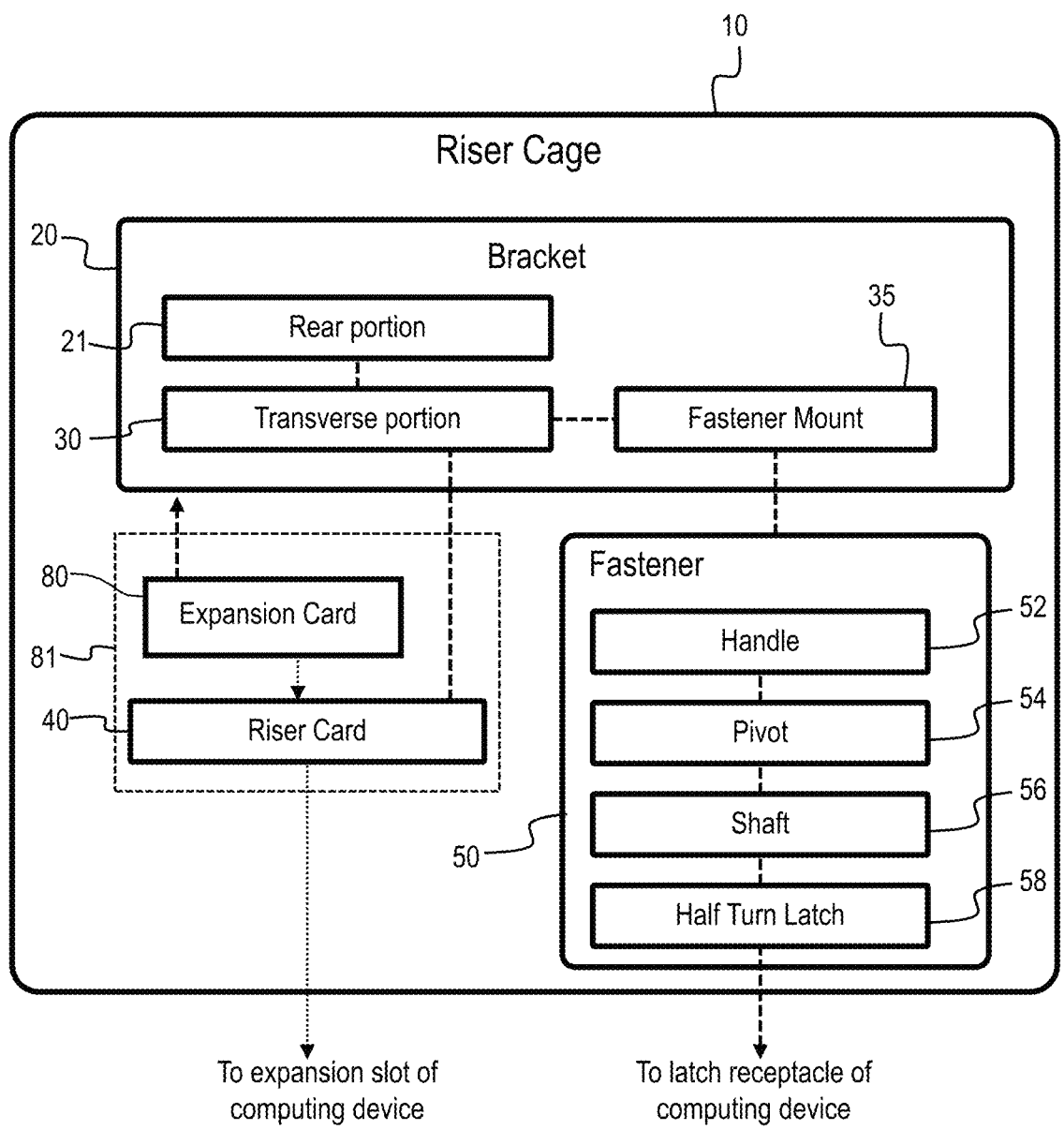
FIG. 1 is a block diagram illustrating an example riser cage assembly.

Riser cages are attached to the chassis and/or system board of the computing device via one or more attachment features, which generally include at least one actuatable fastener. In some circumstances, it may be desired for these fasteners to be manually actuatable without the use of tools, as this may make installation and removal of the riser cage easier. However, many existing toolless fasteners tend to require some free space around them to allow a user to grasp and actuate the fastener. However, in some space constrained computing devices, there may not be sufficient free space to accommodate certain toolless fasteners. While the amount of space that is needed for actuating such a fastener may seem small, computing devices tend to be very space-constrained and allocating even a small amount of space to the riser cage fastener may mean that other components of the system need to be left out or made smaller, which may not be feasible. Thus, it can be challenging to provide a riser cage fastener which is easy to install or remove but which can also fit within tight space constraints.

A technical solution to the aforementioned problems may include a half-turn fastener for a riser cage which has a handle which can be selectively stowed when not in use or deployed when it is needed to actuate the fastener. The half-turn fastener may comprise a half-turn latch, which engages with a receptacle anchored to the computing device to selectively latch to or unlatch from the receptacle. The fastener can be switched between a fastened state and an unfastened state by rotation of the fastener (and hence the half-turn latch) 180 degrees (a half turn). The handle is coupled to the half-turn latch via a shaft so that a user may fasten or unfasten the fastener by grasping the handle and turning the handle 180 degrees about an axis of the shaft. The handle is coupled to the shaft by a pivot pin, which allows the handle to also be pivoted about a pivot axis perpendicular to the shaft. This pivoting about the pivot axis allows the handle to be moved between the stowed and deployed configurations. In the deployed configuration the handle protrudes above the riser cage, whereas in the stowed configuration, the handle does not protrude above the riser cage. Thus, with the handle deployed above the riser cage, there may be sufficient space around the handle for the user to grasp and actuate the handle. Moreover, with the handle stowed, the space above the riser cage may be free of obstructions, and thus other items (such as a cover of the chassis or another riser cage) may be placed in this space. In this manner, the half-turn fastener disclosed herein may be easily actuatable while also fitting within a tightly space constrained system.

Furthermore, in some examples, the handle is configured such that, in the stowed configuration, the handle is parallel to the riser card of the riser cage. For example, in some implementations the handle may have a proximal portion which extends from the shaft in a first direction and a distal portion which extends from the proximal portion in a second direction transverse to the first direction, thus giving the handle a generally "L" shaped profile, and the handle is configured such that in the stowed configuration this L-shape is parallel to the riser card (e.g., the plane defined by the first and second directions is parallel to the riser card). In some examples, in the stowed configuration, the proximal portion extends horizontally while the distal portion extends vertically downward, and conversely in the deployed configuration the proximal portion extends horizontally while the distal portion extends vertically upward. In particular, in some examples, in the stowed configuration, the proximal portion extends horizontally forward (i.e., away from a rear portion of the riser cage bracket). The aforementioned configurations of the handle keep the stowed handle from protruding laterally into the riser cage volume, thus allowing other components to be positioned in this space—for example, some expansion cards may extend into the space laterally adjacent to the fastener. By avoiding the stowed handle obstructing the other components, more components may be fit within a given space and/or the riser cage and the computing device as a whole to be made more compact. Moreover, as noted, in some examples the stowed handle may protrude in a forward direction, which in some circumstance may be a more desirable direction for the fastener to extend because in some computing devices the space forward of the fastener is usually not occupied and thus the stowed handle does not obstruct anything by protruding into this space. In addition, because there is usually some open space forward of the fastener, a user can easily extend their finger down through this open space to reach under the handle to move it to the deployed configuration. Moreover, in the stowed configuration, the pivot axis is perpendicular to the riser card so that while pivoting the handle from the stowed state to the deployed state, the handle remains parallel to the riser card throughout the motion, which avoids any interference with objects located laterally adjacent to the fastener (such as a large expansion card).

In contrast, in a riser cage with a fastener that has a stowable handle which is parallel to the system board and extends laterally when stowed, it may be difficult to achieve the same compactness described above. In such a system, the stowed handle may obstruct objects from being positioned laterally adjacent to the fastener, which may prevent larger components (e.g., expansion cards) from being used or may require the riser cage to be made longer to accommodate those components. Moreover, even in cases in which an expansion card is not directly obstructed by the handle, the expansion card may be close enough to the fastener that it is difficult for the user to reaching their finger under the handle to grasp the handle and move it to the deployed position.

Turning now to the figures, various devices, systems, and methods in accordance with aspects of the present disclosure will be described.

FIG. 1 is a block diagram conceptually illustrating a riser cage 10. It should be understood that FIG. 1 is not intended to illustrate specific shapes, dimensions, or other structural details accurately or to scale, and that implementations of the riser cage 10 may have different numbers and arrangements of the illustrated components and may also include other parts that are not illustrated. In FIG. 1, physical connections (attachment) are indicated conceptually by dashed lines, whereas electrical connections are indicated conceptually by dotted lines.

As shown in FIG. 1, the riser cage 10 comprises a bracket 20, a riser card 40 connected to the bracket 20, and a fastener 50 connected to the bracket 20. These components will be described in greater detail in turn below.

The bracket 20 may comprise a rear portion 21, a transverse portion 30, and a fastener mount 35. The rear portion 21 is configured to attach to a chassis of a computing device when the riser cage 10 is installed in the computing device. The transverse portion 30 is connected to the rear portion 21 and comprises one or more support structures oriented transverse to the rear portion 21. The rear portion 21 and the transverse portion 30 define a riser cage volume 81 in which an expansion card 80 may be received. The fastener mount 35 and riser card 40 are both attached to the transverse portion 30.

As noted above, the rear portion 21 attaches to the chassis of the computing device. More specifically, the rear portion 21 attaches either directly to the chassis or to other components which are, directly or indirectly, attached to the chassis. The rear portion 21 may form part of the chassis once attached thereto. For example, the rear portion 21 may form part of a rear panel of a chassis when installed. The rear portion 21 is described as the "rear" portion because in a typical installation scenario the riser cage 10 may be installed at a rear of the computing device with the rear portion 21 oriented towards a rearward direction, but this terminology is used merely for convenience, and does not limit the orientation of the riser cage 10 or the computing device in practice. For example, the riser card 10 could be installed at a front of a computing device with the rear portion 21 facing in a forward direction and forming a part of the front panel of the chassis. To enable attachment of the rear portion 21 to the chassis (or adjacent components) the rear portion 21 may comprise attachment features, such as tabs, spools, apertures, slots, or the like which engage with complementary attachment features of the chassis and/or of adjacent components to (directly or indirectly) secure the rear portion 21 to the chassis. The rear portion 21 may have a window panel which has perforations, slots, or other openings to allow airflow through the rear portion 21. The rear portion 21 (specifically the window panel thereof) is generally parallel to a first plane, which is parallel to the front and rear panels of the chassis when the riser cage 10 is installed therein.

The transverse portion 30 is attached to the rear portion 21. The transverse portion 30 comprises a side portion, a top portion, or both a side portion and a top portion. The side portion (when included) comprises a panel which is generally parallel to a second plane and is connected to the rear portion 21. The second plane is perpendicular to the first plane and is also parallel to side walls of the chassis when the riser cage 10 is installed thereon. The top portion (when included) comprises a panel which is generally parallel to a third plane and connected to the rear portion 21. The third plane is perpendicular to both the first and second planes and is also parallel to top and bottom walls of the chassis when the riser cage 10 is installed therein. In some examples in which both side and top portions are present, the top and side portions may be connected to one another and both may be connected to the rear portion 21. In some examples, the transverse portion 30 is integrally connected to the rear portion 21, or in other words the transverse portion 30 and the rear portion 21 are part of a unitary body (e.g., a single piece of sheet metal which has been bent, stamped, or otherwise formed into the shape of the bracket 20).

As noted above, the fastener mount 35 is coupled to the transverse portion 30. The fastener mount 35 may be positioned near a front end of the bracket 20, which is the end opposite from the rear portion 21.

The riser card 40 is disposed within the riser cage volume 81 and is physically attached to the transverse portion 30 of the bracket 20. In some examples in which the transverse portion 30 comprises a side portion, the riser card 40 is attached to the side portion. The riser card 40 comprises a PCA with two electrical connectors: a first connector configured to electrically connect to an expansion slot of the computing device and a second connector configured to electrically connect to an expansion card 80 disposed within the riser cage volume 81 of the riser cage. The riser card 40 is oriented parallel to the transverse portion 30 (parallel to the second plane).

The fastener 50 is connected to the fastener mount 35. The fastener 50 is configured to engage with a latch receptacle of the computing device to secure the riser cage to the chassis (directly or indirectly). The latch receptacle may be coupled to the system board, a support structure which supports the system board, or to the chassis. In some examples, the fastener 50 is not the sole mechanism which supports and secures the riser cage 10 to the chassis. As noted above, in some examples the rear portion 21 comprises attachment features to connect to the chassis. Thus, in such examples, the attachment features at the rear portion 21 may support and secure the rear of the riser cage 10 to the chassis, whereas the fastener 50 may support and secure the front side of the riser cage 10. In addition, the other attachment features, when present, may not fully secure the riser cage 10 to the chassis in all cases. For example, the attachment features may be configured such that they constrain the riser cage 10 in some directions but allow movement of the riser cage 10 in certain other directions, and such movement of the riser cage 10 may result in the attachment features disengaging from the chassis. Accordingly, one purpose of the fastener 50 in such examples is to prevent such movements of the riser cage 10 that would otherwise cause the other attachment features to disengage. In this manner, the attachment features and the fastener 50 may work together to secure the riser cage 10 to the chassis.

The fastener 50 comprises a half-turn latch 58 at one end and a handle 52 at the opposite end, with a shaft 56 connecting the two. The half-turn latch 58 is configured to be extended into a latch receptacle of the computing device when the riser cage 10 is installed therein and engage with latch elements in the receptacle to selectively latch to or unlatch from the receptacle. The fastener 50 is configured to be changeable between a fastened state and an unfastened state by rotation and translation of the fastener 50 about and along the axis of the shaft 56.

When the riser cage 10 is positioned in, but not yet attached to, the computing device, transitioning the fastener to the fastened state comprises extending the half-turn latch 58 into the receptacle (e.g., by causing the fastener 50 to move downward along the axis of the shaft 56) and then rotating the half-turn latch 58 within the receptacle by rotating the fastener 50 in a first rotational direction until it reaches a first orientation. The half-turn latch 58 may comprise engagement features (e.g., grooves) which progressively engage with complementary engagement features (e.g., protrusions) of the latch receptacle as the fastener 50 is rotated. A fully latched configuration between these engagement features is achieved when the fastener 50 reaches the first orientation, whereupon the half-turn latch 58 (and hence the fastener 50 as a whole) is latched to the receptacle. This in turn secures the riser cage 10 to the computing device.

Conversely, the fastener 50 can be transitioned from the fastened state to the unfastened state by rotating the fastener 50 in a second rotational direction, opposite the first rotational direction, until the fastener 50 reaches a second orientation. As the fastener 50 (and hence half-turn latch 58) is rotated in the second rotational direction, the engagement features and complementary engagement features move out of the latched configuration and progressively become disengaged until eventually being fully unfastened when the fastener 50 reaches the second orientation. At this point, the half-turn latch 58 is unlocked from the receptacle and can be freely removed therefrom. The first orientation and the second orientation may be 180 degrees apart, so that turning the fastener 50 a half turn (180 degrees) changes the fastener between the first orientation (fastened state) and the second orientation (unfastened state).

As noted above, the fastener 50 comprises a handle 52, which is pivotably coupled to the shaft 56 via pivot 54. The handle 52 is graspable by a user to facilitate the user turning the fastener 50 about the axis of the shaft 56. In particular, the handle 52 may have a proximal portion which extends along a first direction and a distal portion which extends from the proximal portion along a second direction transverse to the first direction, thus giving the handle a generally "L" shaped profile. The first direction and the second direction (which correspond to the directions of extend of the proximal and distal portions of the handle 52) together define a plane, which may be referred to herein as the handle plane. The distal portion of the handle provides leverage to the user, making it easier for them to fasten and unfasten the fastener 50.

The handle 52 is coupled to the shaft by a pivot 54, which allows the handle to be pivoted about a pivot axis perpendicular to the axis of the shaft 56. This pivoting about the pivot axis allows the handle 52 to be moved between stowed and deployed configurations. In the deployed configuration the handle 52 protrudes above the riser cage 10, whereas in the stowed configuration, the handle 52 does not protrude above the riser cage 10. Generally, it is unlikely for there to be an obstruction in the region directly above the riser cage 10 when the handle is being deployed, because any components that would normally occupy this region (such as a cover of the computing device or another riser cage) are removed from the device prior to attempting to install or remove the riser cage 10. Thus, in the deployed state there may be free space all around the handle 52 which allows the user to easily grasp and rotate the handle 52. Moreover, once the riser cage 10 is installed and secured and it is desired to return the computing device to its normal state, the handle 52 can be stowed and thereafter it ceases to protrude above the riser cage 10, thus allowing the other components which would normally occupy that region to be returned to their normal place. In this manner, the half-turn fastener 50 may be easily actuatable when deployed but then can be stowed when not needed to make room for other components, thus allowing for a relatively more compact (space constrained) system to be designed.

In addition, handle 52 is configured such that, in the stowed state, the handle 52 is parallel to the riser card 40 and/or side portion of the bracket 20. References to the handle 52 being parallel to the riser card 40 and/or side portion side portion of the bracket 20 mean that the handle plane defined by the handle 52 (as defined above) is parallel to a riser card 40 or side portion, or in other words parallel to the second plane. This configuration of the handle 52 allows the stowed handle 52 to not protrude laterally into the riser cage volume. Instead, the handle 52 may protrude in a forward direction (away from the rear portion 21 of the riser cage 10). This protrusion in a forward direction is generally more desirable than protrusion in a lateral direction, as the region directly forward of the fastener 50 is usually not occupied, whereas it may be desired to occupy the region directly laterally adjacent the fastener 50 with other objects, such as the expansion card. Moreover, in the stowed state, the pivot axis is perpendicular to the riser card 40 so that when pivoting the handle 52 from the stowed state to the deployed state the handle 52 remains parallel to riser card 40 throughout the motion. Thus an object (e.g., expansion card) can be disposed laterally adjacent to the fastener 5 without interfering with the pivoting of the handle 52 between deployed and stowed configurations. In addition, because there is usually open space forward of the fastener 50, a user can easily extend their finger down through this open space to reach under the handle 52 to grasp and deploy it.

In some examples, the expansion card 80 is included in the riser cage 10 (within the riser cage volume 81), with the expansion card 80 being electrically connected to the riser card 40 (as indicated by the dot-lined arrow in FIG. 1) and physically attached to the bracket 20 (as indicated by the dash-lined arrow in FIG. 1). In other examples, the riser cage 10 does not include the expansion card 80; in other words, although the riser cage 10 may be intended for use with the expansion card 80, in some cases the riser cage 10 may be provided (e.g., manufactured, sold, installed in a computing device, etc.) separately from the expansion card 80.

Figure 17:
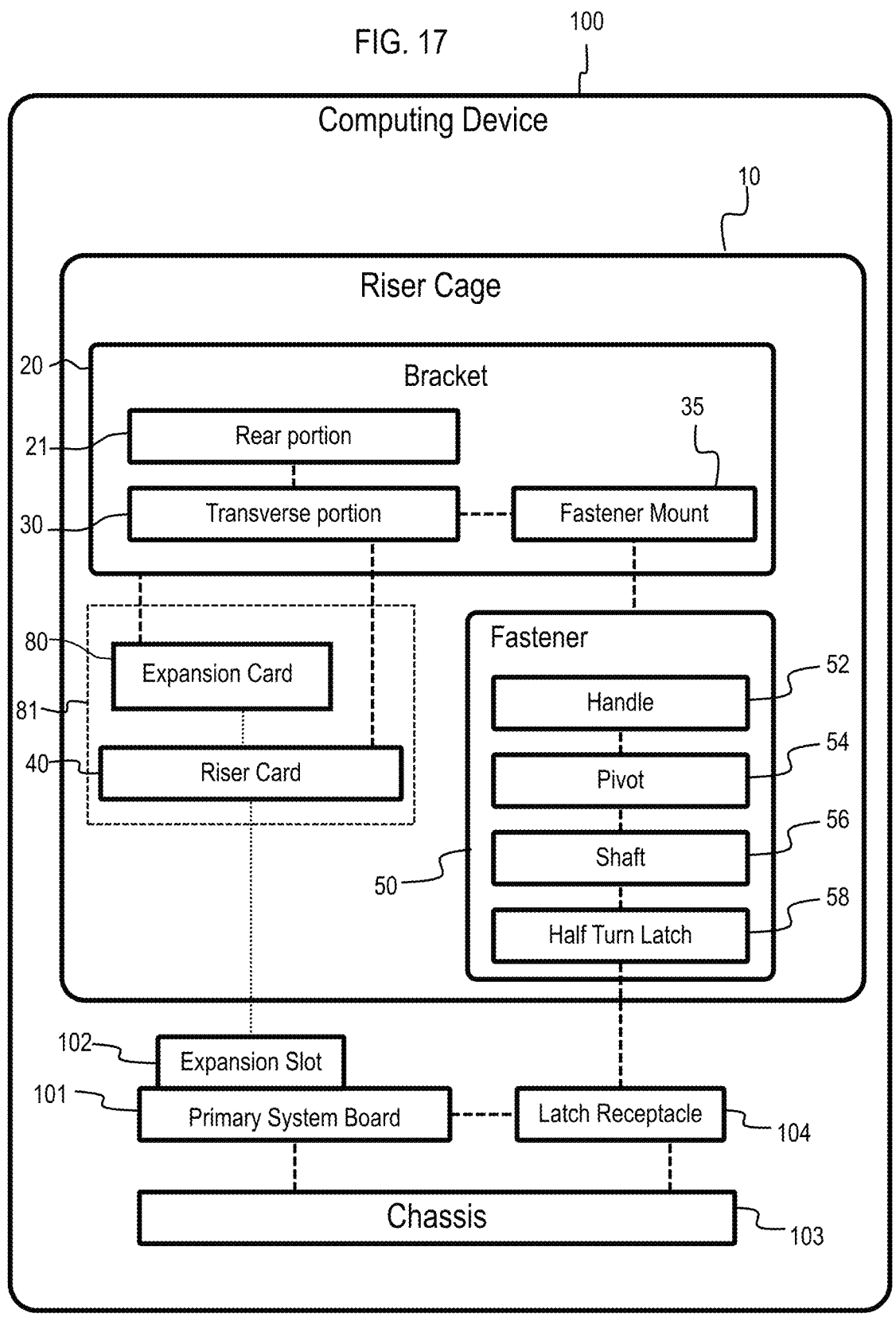
FIG. 17 is block diagram illustrating an example computing device with the riser cage assembly of FIG. 1 installed therein.

As shown in FIG. 17, in some examples, a computing device 100 comprises the riser cage 10 installed therein. The computing device 100 comprises a chassis 103, a primary system board 101 attached (directly or indirectly) to and supported by the chassis 103, an expansion slot 102 mounted to the primary system board 101, and a latch receptacle 104 attached to the chassis 103 and/or to primary system board 101. In the installed state of the riser cage 10 in the computing device 100, the riser card 40 is electrically connected to the expansion slot 102, and the fastener 50 is engaged with and fastened to the latch receptacle 104. The expansion card 80 is disposed in the riser cage volume 81, is electrically connected to the riser card 40, and is attached to the bracket 20.

Turning now to FIGS. 2-16, another example riser cage 110 will be described. The riser cage 10 is one example configuration of the riser cage 10. Thus, some components of the riser cage 110 correspond to (i.e., are the same as, similar to, and/or example configurations of) components of the riser cage 10 described above. The components of the riser cage 110 and the components of the riser cage 10 which correspond to one another are given reference numbers with the same last two digits, such as 50 and 150. The descriptions above of the components of the riser cage 10 are applicable to the corresponding components of the 110 (unless otherwise indicated or logically contradictory), and thus duplicative descriptions of some aspects already described above are omitted below. In some examples, the riser cage 10 included in the computing device 100 of FIG. 17 may comprise the riser cage 110.

FIGS. 2-16 show the riser cage 110 in various perspectives and in various states, and aspects of the riser cage 110 may be visible in multiple of the figures. The description below will refer to the figures as and when they are relevant to the aspect being described, rather than in strict numerical order. Various aspects of the riser cage 110 are described herein in relation to the X, Y, and Z axes illustrated in FIGS. 2-16. In addition, herein an XY plane may be referred to, which is a plane defined by the X and Y axes. Similarly, an XZ plane may be referred to, which is a plane defined by the X and Z axes. Also, a YZ plane may be referred to, which is a plane defined by the Y and Z axes. Things which are parallel to the XY plane may be described herein as "horizontal," whereas things which are parallel to either the XZ or YZ plane may be described as "vertical." Occasionally, a structure is referred to herein as being parallel or perpendicular to a plane (or to another structure), and it should be understood that such references refer to the orientation of a broadest face of the structure (i.e., not to edges).

As shown in FIGS. 2-5, the riser cage 110 comprises a bracket 120, a riser card 140 connected to the bracket 120, and a fastener 150 connected to the bracket 120.

The bracket 120 comprises a rear portion 121, a side portion 131, a top portion 139, and a fastener mount 135. The rear portion 121 is configured to attach to a chassis of a computing device when the riser cage 110 is installed in the computing device. The side portion 131 and top portion 139 are both connected to the rear portion 121 and to one another (the side portion 131 and top portion 139 together are an implementation example of the transverse portion 30 in FIG. 1). The rear portion 121, side portion 121, and top portion 139 define a riser cage volume 181 in which an expansion card 180 may be received. The fastener mount 135 is attached to the top portion 139, and the riser card 140 is attached to the side portion 131. These components will be described in greater detail in turn below.

Figure 4:
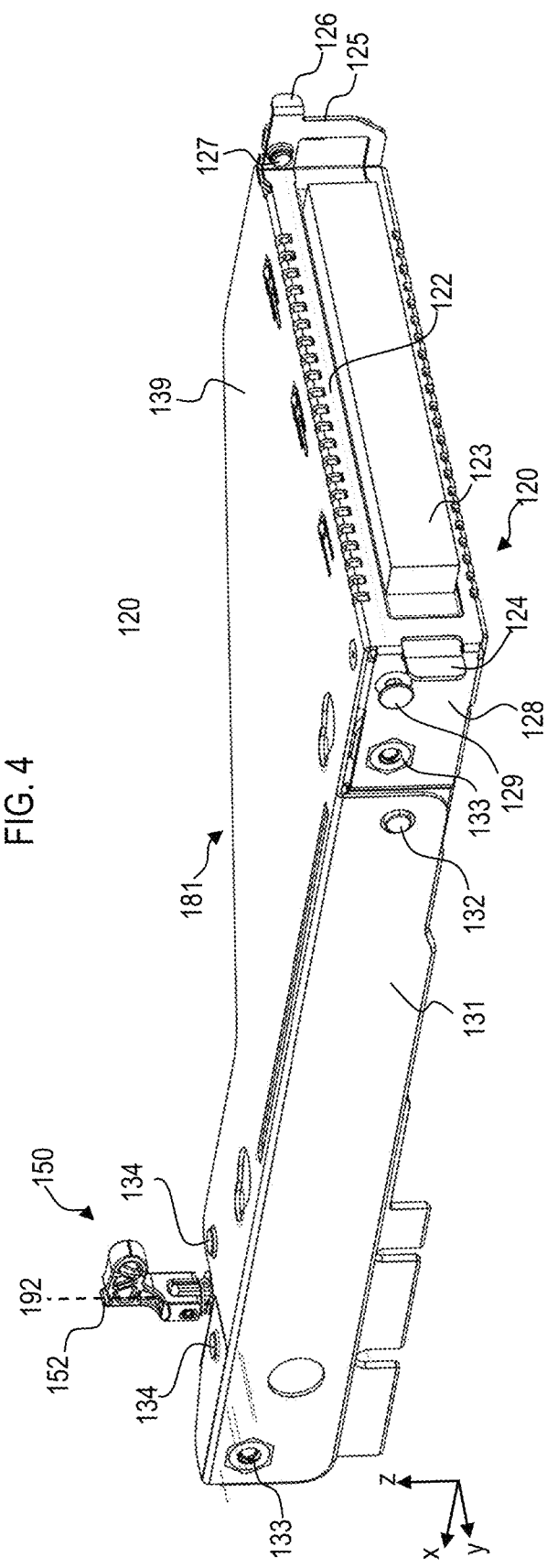
FIG. 4 is another perspective view of the example riser cage assembly of FIG. 2 with the half-turn fastener in the unfastened state and with expansion card omitted.
Figure 5:
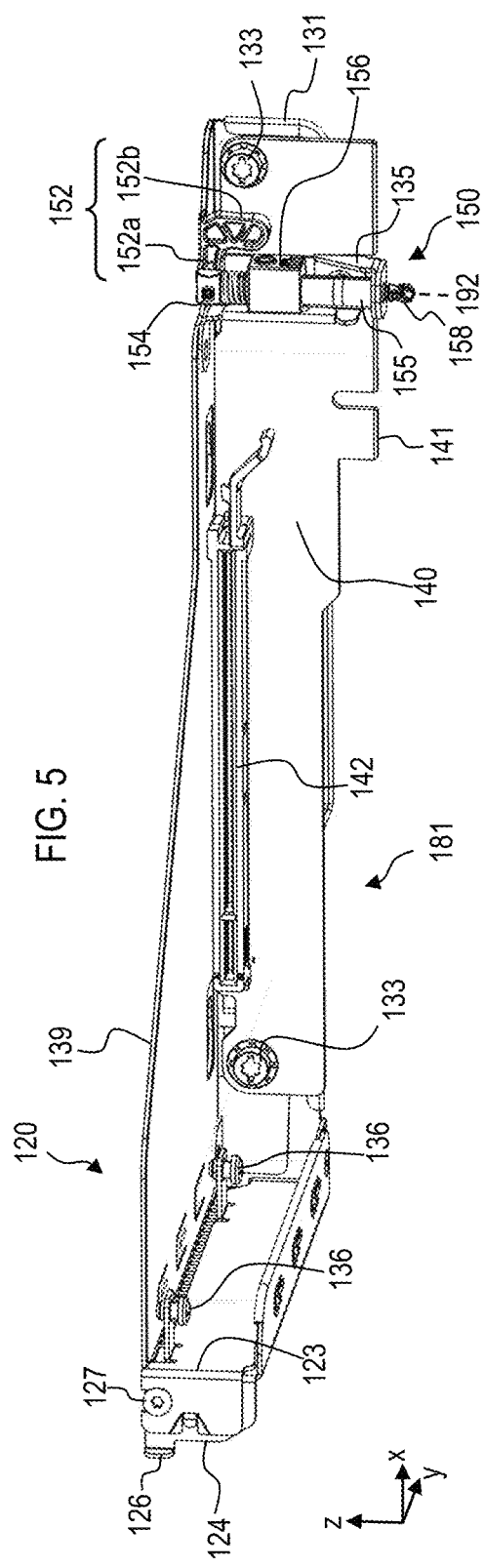
FIG. 5 is another perspective view of the example riser cage assembly of FIG. 2 with the half-turn fastener in the fastened state and with expansion card omitted.

FIGS. 4 and 5 illustrate the rear portion 121 of the bracket 120. The rear portion 121 comprises a window panel 122. The window panel 122 is generally parallel to a first plane. This first plane is parallel to the YZ plane. The first plane is also parallel to the front and rear panels of the chassis when the riser cage 110 is installed therein. The window panel 122 is configured to receive a window insert 123. The window insert 123 is coupled to the window panel 122 via attachment features 124 and 127. In the illustrated example, the attachment feature 124 comprises a tab that is inserted through a slot in the window panel 122, and the attachment feature 127 is a screw that engages an aperture in a flange 125 attached to the window panel 122. In other examples, other attachment features may be used. The window insert 123 may have perforations, slots, or other openings (not illustrated) to allow airflow through the rear portion 121. As shown in FIG. 5, the window insert 123 comprises attachment features 136 which are configured to attach to the expansion card 180. Thus, the expansion card 180 is secured to the window insert 123, which is in turn secure to the window panel 122.

The rear portion 121 also comprises attachment features 126 and 129, which are best seen in FIG. 4. In the illustrated example, the attachment features 126 and 129 comprise a tab and a spool, respectively, which are configured to engage with complementary attachment features of the chassis or of an adjacent component of the computing device. In other examples, any other type of attachment features may be used.

As shown in FIG. 4, the rear portion 121 is connected to the side portion 131 and to the top portion 139. In the illustrated example, the top portion 121 is integrally connected to the window panel 122 (e.g., they are formed from the same unitary body). In other examples, they may be separate parts which are connected together via mechanical fasteners, welding, adhesives, friction fittings, or any other fastening technique. The rear portion 121 also comprise a wing 128 which is attached to the window panel 122 but which extends perpendicular to the window panel 122. For example, the wing 128 may be integrally connected to the window panel 122 and may be bent into the position shown in FIG. 4. The wing 128 may partially overlap with the side portion 131 (in FIG. 4, the end (not visible) of the wing 128 is tucked behind the side portion 131) and the overlapping portions of the wing 128 and side portion 141 may be attached via fastener 132. In other examples, the wing 128 may be attached to the side portion 141 by welding, adhesives, interlocking engagement, or any other fastening technique.

As shown in FIGS. 2-5, the side portion 131 comprises a panel which is generally parallel to a second plane, which is perpendicular to the first plane. This second plane is parallel to the XZ plane, which is parallel to side walls of the chassis when the riser cage 110 is installed thereon. The top portion 139 comprises a panel which is generally parallel to a third plane, which is perpendicular to the first plane and to the second plane. The third plane is parallel to the XY plane, which is parallel to top and bottom walls of the chassis when the riser cage 110 is installed therein. In the illustrated example, the top portion 139 is integrally connected to the side portion 131. Thus, in the illustrated example, the rear portion 121, side portion 131, and top portion 139 of the bracket 120 are all part of a unitary body (e.g., a single piece of sheet metal which has been bent, stamped, or otherwise formed into the shape of the bracket 120) and are all mutually perpendicular to one another.

As shown in FIGS. 2-5, the riser card 140 is connected to the side portion 131 via fasteners 133. The riser card 140 is parallel to the XZ plane and to the side portion 131. As shown in FIG. 5, the riser card comprises a first electrical connector 141 and a second electrical connector 142. The first connector 141 is configured to mate with and electrically connect to a complementary electrical connector on the primary system board of the computing device when the riser cage 110 is installed therein. For example, FIGS. 6-9, which are described in greater detail below, illustrate schematically the first connector 141 mating with the expansion slot 202, which is a complementary electrical connector connected to a primary system board 201. In the illustrated example, the first connector 141 is an edge connector (also called a PCB edge connector or PCB gold finger connector), whereas the expansion slot 202 is a female receptacle which receives the first connector 141. In some examples, the first connector 141 is a PCIe edge connector configured to mate with a PCIe socket. The second connector 142 is configured to mate with and electrically connect to a complementary electrical connector on the expansion card 180 when the expansion card 180 is installed in the riser cage 110. As shown in FIG. 5, in the illustrated example, the second connector 142 is a female receptacle which is to receive an edge connector of the expansion card 180. In some examples, the second connector 142 is a PCIe socket.

As shown in FIGS. 2, 3, and 10-14, the fastener 150 comprises a half-turn latch 158 at one end and a handle 152 at the opposite end, with a shaft 156 connecting the two. The fastener 150 also comprises a housing 155 through which the shaft 156 extends (via a bore). The housing 155 connects the fastener 150 to the fastener mount 135 while allowing the fastener 150 to rotate and translate relative to the fastener mount 135, as will be described in greater detail below. The half-turn latch 158 is configured to be extended into a latch receptacle 204 of the computing device when the riser cage 110 is installed therein and engage with latch elements 205 in the receptacle 204 (see FIG. 8) to selectively latch to or unlatch from the receptacle 204. The fastener 150 is configured to be changeable between a fastened state and an unfastened state by 180-degree rotation of the fastener 150 about the axis 192 of the shaft 156, as will be described in greater detail below.

As mentioned above and as shown in FIGS. 2-4, the fastener 150 comprises a handle 152 coupled to the shaft 156. The handle 152 is graspable by a user to facilitate the user turning the fastener 150 about the axis 192 (see FIG. 4). In particular, as best seen in FIGS. 10-14, the handle 152 may have a proximal portion 152a, which extends along a first direction 193 and a distal portion 152b which extends from the proximal portion 152a along a second direction 194 transverse to the first direction 193, thus giving the handle a generally "L" shaped profile. The first direction 193 and the second direction 194 together define a plane, which may be referred to herein as the handle plane. The handle plane may change orientations as the fastener is transitioned between states, as will be described below. The distal portion 152b of the handle 152 provides leverage to the user, making it easier for them to rotate the fastener 150 to fasten and unfasten the fastener 150.

The handle 152 is coupled to the shaft by a pivot 154 (e.g., pivot pin), which allows the handle 152 to be pivoted about a pivot axis 191 perpendicular to the axis 192 of the shaft 156. This pivoting about the pivot axis 191 allows the handle 152 to be moved between a stowed configuration and a deployed configuration, which will be described below.

FIGS. 2, 4, 6-8, 11, 13, and 14 illustrate the handle 152 in the deployed configuration. As shown in FIG. 2, in the deployed configuration, the proximal portion 152a of the handle 152 extends vertically upward (i.e., in the +z direction). In addition, in the deployed configuration the distal portion 152b extends in any horizontal orientation (i.e., any orientation parallel to the XY plane). As shown in FIG. 2, in the deployed configuration the handle 152 protrudes upward (in the +z direction) above the riser cage 110. Generally, it is unlikely for there to be an obstruction in the region directly above the riser cage 110 when the handle 152 is in the deployed configuration because the components which would normally occupy this region (such as a cover, another riser cage, or other component) are removed prior to attempting to install or remove the riser cage 110. Thus, with the handle 152 protruding above the riser cage 110 in the deployed state, there may be sufficient free space around the handle 152 for the user to easily grasp and rotate the handle 152.

Figure 9:
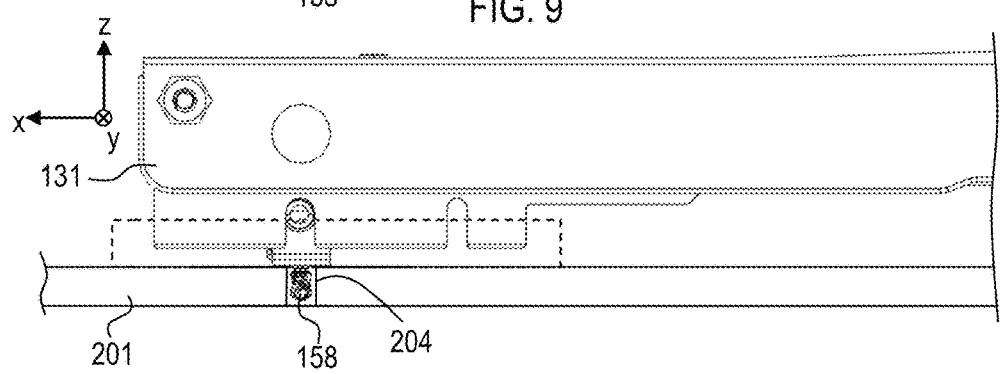
FIG. 9 is a side view of the example riser cage assembly of FIG. 2 in a fourth state during an installation process.
Figure 10:
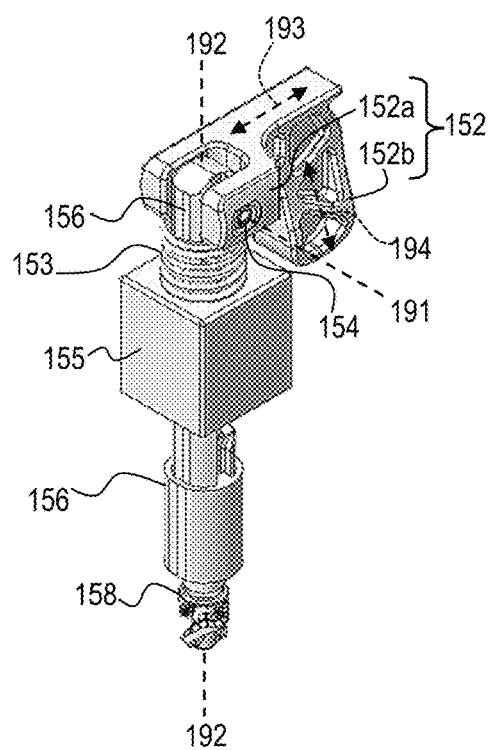
FIG. 10 is a perspective view of the half-turn fastener of the riser cage assembly of FIG. 2 in isolation, with the half-turn fastener in the fastened state.
Figure 11:
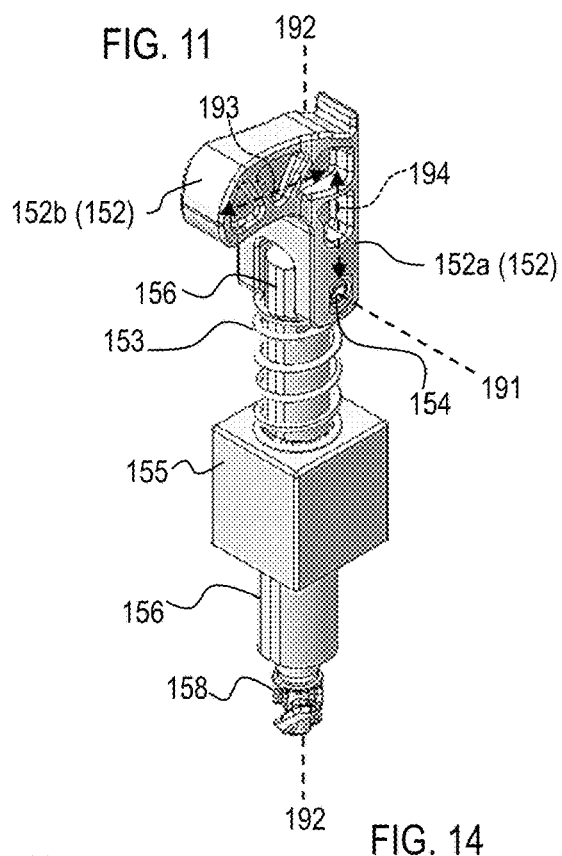
FIG. 11 is a perspective view of the half-turn fastener of the riser cage assembly of FIG. 2 in isolation, with the half-turn fastener in the unfastened state.
Figure 12:
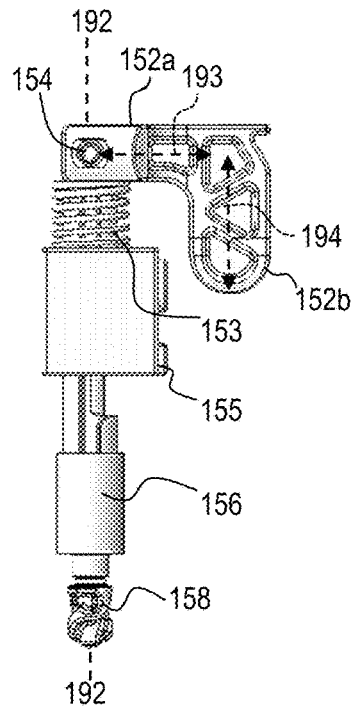
FIG. 12 is a side view of the half-turn fastener of the riser cage assembly of FIG. 2 in isolation, with the half-turn fastener in the fastened state with handle stowed.

FIGS. 3, 5, 9, 10 and 12 illustrate the handle 152 in the stowed configuration. As shown in FIG. 3, in the stowed configuration, the proximal portion 152a of the handle 152 extends horizontally forward (i.e., away from the rear portion 121, or in the +x direction), while the distal portion 152b extends vertically downward (i.e., −z direction). In addition, as shown in FIGS. 3, 5, and 9, in the stowed configuration, the handle 152 does not protrude significantly (in some examples, not at all) above the riser cage 110. Thus, after the riser cage 110 has been installed and secured, the handle 152 can be stowed and thus the handle 152 ceases to occupy the space above the riser cage 110, allowing for the other components which were previously removed to be returned to their normal positions. Thus, the stowed state allows the fastener 150 to be compacted during normal system operation so as to not obstruct the other items in the computing device, while the deployed state allows the fastener 150 to be uncompacted during installation/removal to facilitate easier actuation of the fastener 150.

In addition, handle 152 is configured such that, in the stowed state, the handle 152 is parallel to the riser card 140 and side portion 131. In other words, in the stowed position, the handle plane is parallel to the XZ plane. Thus, the stowed handle 152 does not protrude laterally in the −y direction into the riser cage volume 181. Instead, the handle 152 may protrude in a forward (+x) direction, as described above. This protrusion in a forward direction is generally more desirable than protrusion in a lateral direction, as the region directly forward of the fastener 150 is usually not occupied, whereas it may be desired to occupy the region directly laterally adjacent the fastener 150. For example, although a shorter expansion card 180 is illustrated in FIG. 3 to allow for better visibility of the fastener 150, the riser cage 110 may also be capable of receiving longer expansion cards which extend further in the +x direction, and thus are positioned laterally adjacent to the fastener 150. In addition, because there is usually open space forward of the fastener 150, a user can easily extend their finger down through this open space to reach under the handle 152 to grasp and deploy it.

Moreover, in the stowed state, the pivot axis 191 is perpendicular to the riser card 140, as shown in FIG. 3, and thus as the handle 152 pivots from the stowed state to the deployed state, the handle 152 remains parallel to the ZY plane throughout the motion. This allows the deployment of the handle 152 to not be obstructed by any objects which happen to be positioned laterally adjacent to the fastener 150, such as the large expansion card described above.

Figure 6:
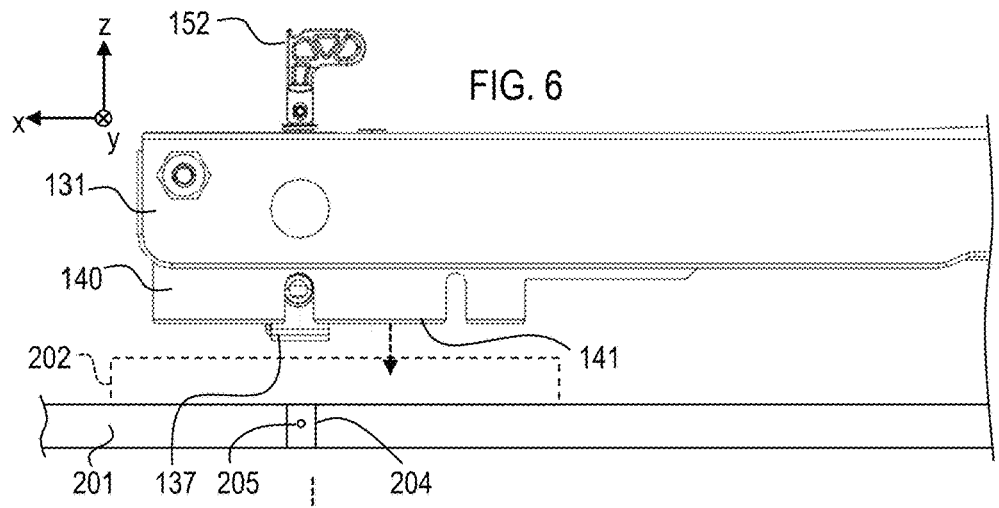
FIG. 6 is a side view of the example riser cage assembly of FIG. 2 in a first state during an installation process.
Figure 7:
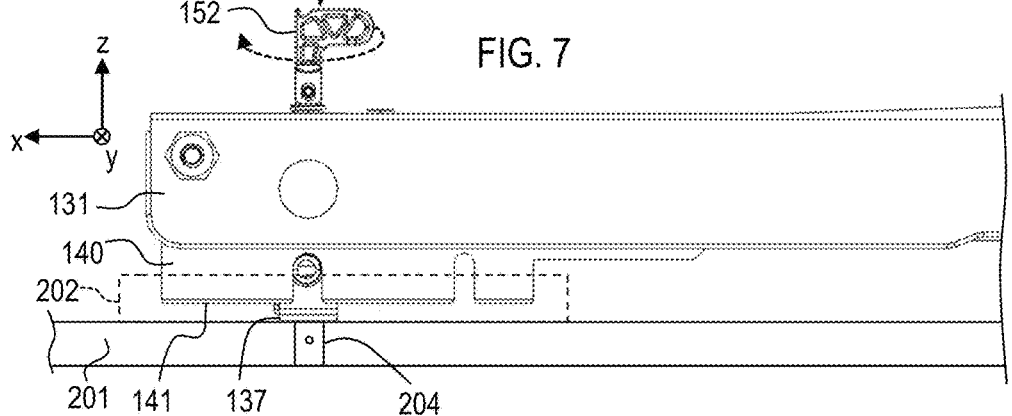
FIG. 7 is a side view of the example riser cage assembly of FIG. 2 in a second state during an installation process.
Figure 14:
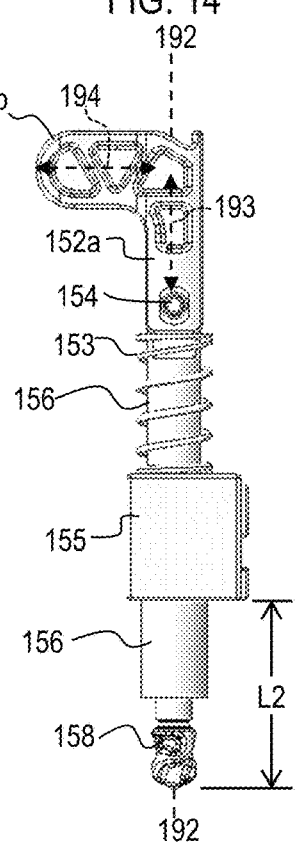
FIG. 14 is a side view of the half-turn fastener of the riser cage assembly of FIG. 2 in isolation, with the half-turn fastener in the unfastened state.

As mentioned above, the fastener can be transitioned between fastened and unfastened states. FIGS. 2, 4, 6, 11, and 14 illustrate the fastener 150 in the unfastened state. The unfastened state is characterized by the fastener 150 being oriented at a first rotational orientation. More specifically, in the first rotational orientation, the distal portion 152b of handle 152 points rearward towards the rear portion 121 (i.e., in a-x direction), as shown in FIGS. 2 and 6. In addition, in some examples, in the unfastened state, the fastener 150 may be at a retracted position. As shown in FIG. 14, in this retracted position, the tip of the latch 158 is located a distance L2 from the bottom of the housing 155, which is higher in the +z direction than a lowest possible position for the latch 158. In some examples, the retracted position is one in which the latch 158 does not extend fully into the receptacle 204 and/or is retracted above a bottom of the fastener mount 135 (i.e., above the floor 137), as shown in FIGS. 2 and 7. A spring 152 may be provided around the shaft 156, between the housing 155 and the handle 152, to bias the fastener 150 towards the retracted position.

Figure 8:
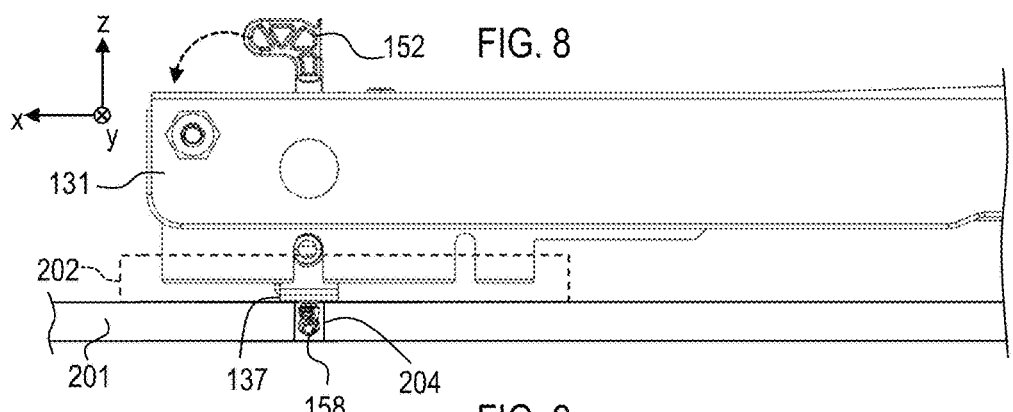
FIG. 8 is a side view of the example riser cage assembly of FIG. 2 in a third state during an installation process.
Figure 13:
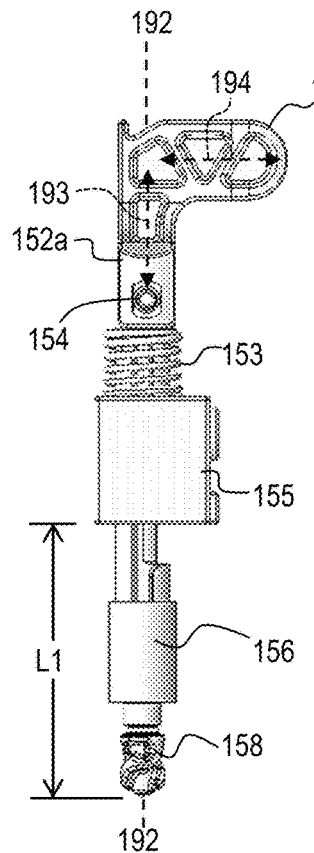
FIG. 13 is a side view of the half-turn fastener of the riser cage assembly of FIG. 2 in isolation, with the half-turn fastener in a fastened state with handle deployed.

FIGS. 3, 5, 8, 9, 10, and 12 illustrate the fastener 150 in the fastened state. The fastened state is characterized by the fastener 150 being oriented at a second rotational orientation and at an extended position. More specifically, in the second rotational orientation, the distal portion 152b of handle 152 points forward (i.e., away from the rear portion 121, in a +x direction), as shown in FIGS. 3 and 8. The extended position of the fastener 150 comprises a position in which the latch 158 is extended farther downward (in the −z direction) than in the retracted position. In particular, in some examples, the extended position is one in which the latch 158 is extended sufficiently far downward (in the −z direction) to be received into the receptacle 204 (assuming the riser cage 110 is in the installation position in the computing device) and/or extends beyond a bottom of the fastener mount 135 (e.g., beyond shelf 137), as shown in FIGS. 3 and 8. FIG. 13 illustrates the fastener 150 in the extended position, with the tip of the latch 158 being located a distance L1 from the bottom of the housing 155. The distance L1 in the extended position (FIG. 13) is greater than the distance L2 in the retracted position (FIG. 14).

The transitioning between these states will be described in greater detail below with reference to FIGS. 6-14, which show a sequence of events in an installation of the riser cage 110 in a computing device comprising a primary system board 201. FIG. 6 illustrates a first state, in which the riser cage 110 is brought to an installation position while the fastener 150 is in the unfastened state. In this state, the first connector 141 of the riser card 140 is aligned with the complementary connector 202 of the system board 201, and a shelf 137 of the fastener mount 135 is also aligned with a receptacle 204 which is coupled to the system board 201 (the receptacle 204 could instead be coupled to a support structure or chassis).

The riser cage 110 may then be moved towards the system board 201 along the −z direction as indicated by the dashed arrow in FIG. 6, resulting in the state illustrated in FIG. 7. In this state illustrated in FIG. 7, the first electrical connector 141 is mated with the complementary connector 202. In addition, the fastener 150 remains in the unfastened state. In addition, in some examples, the shelf 137 is adjacent to, and in some examples abutting, the system board 201 and/or the receptacle 204. Although not illustrated, during the transition from the state of FIG. 6 to the state of FIG. 7, the other attachment features 126 and 129 of the riser cage may be engaged with the chassis or other adjacent components.

The fastener 150 may then be transitioned to the fastened state. This comprises moving the fastener 150 downward along axis 192 until the half-turn latch 158 is in the extended position and then rotating the fastener 150 (via the handle 152) 180 degrees about the axis 192 of the shaft 136 until the handle 152 faces forward (+x direction), as indicated by the dashed arrows in FIG. 7. This results in the state illustrated in FIG. 8, in which the half-turn latch 158 has extended into the receptacle 204 and engaged with the latch elements 205 so as to secure the half-turn latch 158 to the receptacle 204. In other words, the fastener 150 is in the fastened state.

Figure 16:
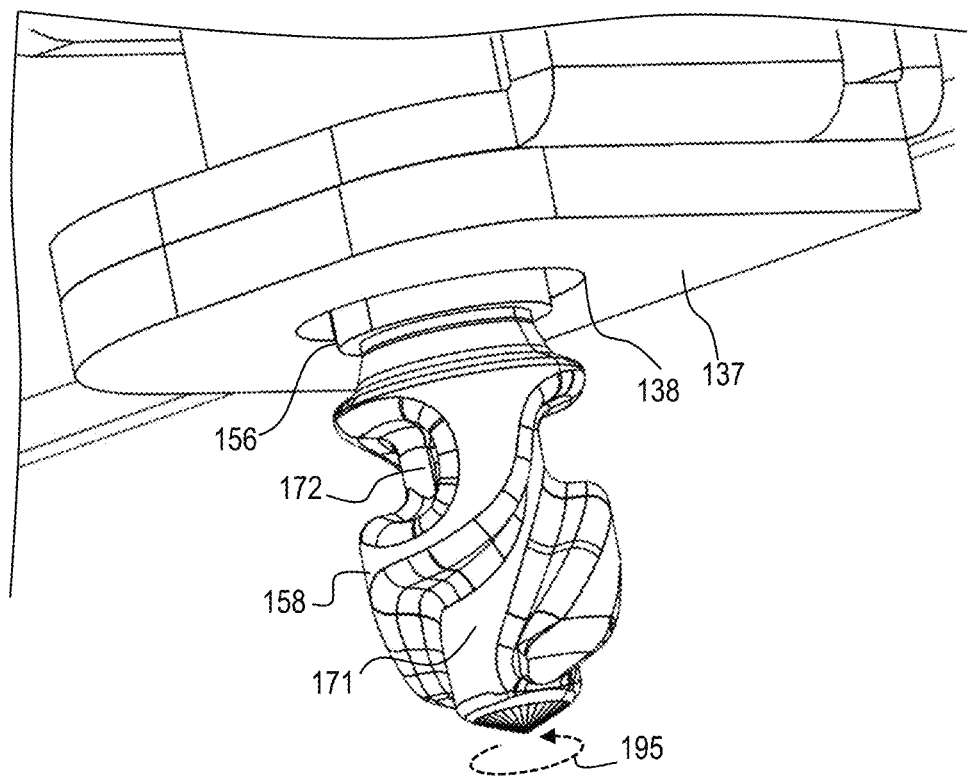
FIG. 16 is a perspective view of a portion of the riser cage assembly of FIG. 2 showing a half-turn latch of the half-turn fastener.

More specifically, as shown in FIG. 16, the half-turn latch 158 may comprises grooves 171 that spiral around and up the latch 158 (like a helix). During the transition from the unfastened state (FIG. 7) to the fastened state (FIG. 8), the fastener 150 is moved down toward the extended position, which causes the latch 158 to enter into the receptacle 204 and the grooves 171 of the latch 158 to receive latch elements 205 of the receptacle 204. These latch elements 205 comprise protrusions which protrude radially inward from the receptacle 204 and extend into the grooves 171. Then, as the fastener 150 is rotated in the first rotational direction 195, each protrusion travels along the groove 171, pulling the fastener 150 farther downward, until eventually the protrusion reaches a catch 172 at the end of the groove 171. This occurs when the fastener 150 is in the first orientation. The catch 172 is designed to hold the protrusion at the end of the groove 171 unless a sufficiently large torque is applied to rotate the fastener 150 in the second rotational direction opposite the first rotational direction 195. With the protrusion in the catch 172, the engagement between the protrusion and groove 171 prevents the latch 158 from being withdrawn from the receptacle 204. Thus, in this state, the fastener 150 is locked to the receptacle.

Returning to FIG. 8, after the fastened state is achieved, the handle 152 may then be pivoted about the pivot 154 to move the handle 152 to the stowed configuration, as suggested by the dashed arrow in FIG. 8. This results in the state illustrated in FIG. 9. In FIG. 9, the fastener 150 remains in the fastened state, but now the handle 152 has been stowed. This may be the state that is used during normal operation of the computing device. It may be noted that FIGS. 8 and 9 both illustrate the fastener 150 in the fastened state, but in FIG. 8 the handle 152 is deployed while in FIG. 9 the handle 152 is stowed. Thus, the state illustrated in FIG. 8 may also be referred to as a fastened and deployed state (also illustrated in FIG. 13), while the state illustrated in FIG. 9 may be referred to as a fastened and stowed state (also illustrated in FIGS. 10 and 12).

The transition from the fastened state to the unfastened state may occur through the reverse of the sequence of events described above. That is, starting in the state illustrate in FIG. 9 the handle 152 may first be deployed, resulting in the state illustrated in FIG. 8. Then, the fastener 150 may be rotated in the second rotational direction, which causes the half-turn latch 158 to disengage from the latch elements 205. The fastener 150 may also move upward (+z direction) once the half-turn latch 158 disengages, due to the spring 153. This results in the state illustrated in FIG. 7, in which the fastener 150 is no longer fastened. The riser cage 110 may then be removed from the computing device if desired.

Figure 15:
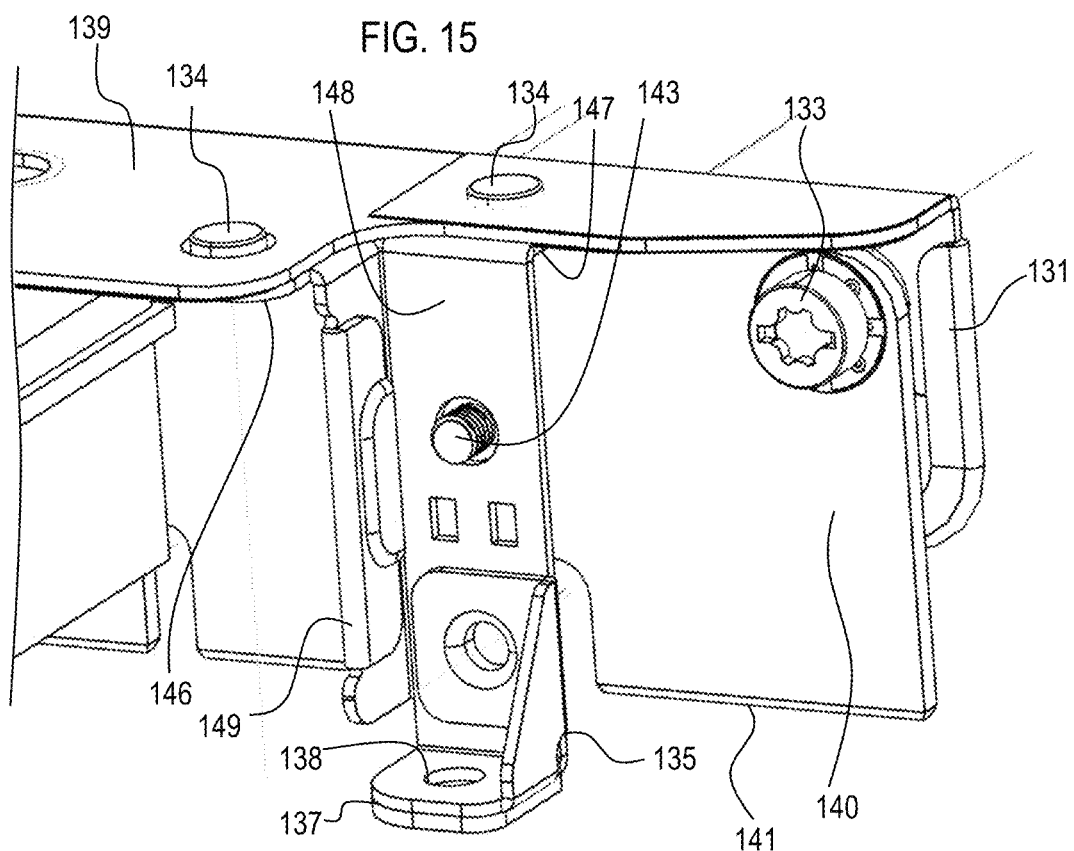
FIG. 15 is a perspective view of a portion of the riser cage assembly of FIG. 2 showing a fastener mount.

As mentioned above, the fastener 150 is connected to the bracket 150 via the fastener mount 135. As shown in FIGS. 2 and 15, the fastener mount 135 is connected to the top portion 139 near a front end of the bracket 120 (i.e., the end opposite from the rear portion 121, or the end in the +x direction). Note that in FIG. 15, the fastener 150 is omitted to allow the fastener mount 135 to be better seen. As shown in FIG. 15, the fastener mount 135 comprises vertical walls 148 and 149, which are coupled to horizontal flanges 146 and 147, respectively. The horizontal flanges 146 and 147 overlap with the top portion 139 and are attached thereto via fasteners 134. The fastener mount 135 also comprises a shelf 137 with an aperture 138. The half-turn latch 158 extends through the aperture 138 when the fastener 150 is in the extended position, as illustrated in FIG. 16 (see also FIGS. 3, 5, and 8). As mentioned above, the shelf 137 may contact the system board 201 and/or receptacle 204, which may provide physical support for riser card 110. As shown in FIG. 15, the fastener mount 135 also comprises a fastener 143, which extends through the vertical wall 148 to engage with the housing 155 of the fastener 150, thereby attaching the fastener 150 to the fastener mount 135 and hence to the bracket 120.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A riser cage for coupling an expansion card to a computing device, comprising:
    a bracket configured to support the expansion card;
    a riser card attached to the bracket and configured to electrically connect the expansion card to the computing device;
    a fastener attached to the bracket, the fastener comprising:
        a handle;
        a shaft extending along a first axis;
        a pivot connecting the handle to the shaft;
        a half-turn latch coupled to the shaft and configured to engage with a receptacle of the computing device to selectively secure the fastener to the receptacle;
        wherein the handle is pivotable about the pivot between a deployed configuration and a stowed configuration, and in the stowed configuration the handle is parallel to the riser card.

2. The riser cage of claim 1,
    wherein the shaft is rotatable about the first axis and the fastener is transitionable between a fastened state and an unfastened state by rotation of the shaft 180 degrees about the first axis.

3. The riser cage of claim 1,
    wherein the handle is pivotable about a second axis perpendicular to the first axis.

4. The riser cage of claim 3,
    wherein the handle is configured to remain parallel to the riser card throughout movement of the handle from the stowed configuration to the deployed configuration.

5. The riser cage of claim 3,
    wherein in a fastened state of the fastener, the second axis is perpendicular to the riser card.

6. The riser cage of claim 1,
    wherein in the stowed configuration, the handle does not protrude above the bracket along a direction of the first axis.

7. The riser cage of claim 6,
    wherein in the deployed configuration, the handle protrudes above the bracket along the direction of the first axis.

8. The riser cage of claim 1,
    wherein the bracket comprises a rear portion and a transverse portion, the fastener coupled to the transverse portion; and
    wherein, in the stowed configuration, the handle extends in a forward direction away from the rear portion.

9. The riser cage of claim 1,
    wherein the handle comprises a proximal portion and a distal portion transverse to the proximal portion;
    wherein, in the stowed configuration, the proximal portion of the handle extends horizontally and distal portion extends vertically.

10. The riser cage of claim 9,
    wherein the bracket comprises a rear portion and a transverse portion, the fastener coupled to the transverse portion; and
    wherein in the stowed configuration, the proximal portion of the handle extends forward away from the rear portion.

11. The riser cage of claim 1, comprising the expansion card electrically connected to the riser card and attached to the bracket.

12. A computing device, comprising:
    a chassis;
    a primary system board comprising an expansion slot and a receptacle, the primary system board supported by the chassis;
    a riser cage coupled to the chassis, the riser cage comprising:
        a bracket;
        an expansion card attached to the bracket;
        a riser card attached to the bracket, electrically connected to the expansion card, and electrically connected to the expansion slot;
        a fastener attached to the bracket, the fastener comprising:
            a handle;
            a shaft extending along a first axis;
            a pivot connecting the handle to the shaft;
            a half-turn latch coupled to the shaft and engaged with the receptacle to selectively secure the fastener to the receptacle;
        wherein the handle is pivotable about the pivot between a deployed configuration and a stowed configuration, and in the stowed configuration the handle is parallel to the riser card.

13. The computing device of claim 12,
    wherein the shaft is rotatable about the first axis and the fastener is transitionable between a fastened state and an unfastened state by rotation of the shaft 180 degrees about the first axis.

14. The computing device of claim 12,
wherein the handle is pivotable about a second axis perpendicular to the first axis.

15. The computing device of claim 14,
wherein the handle is configured to remain parallel to the riser card throughout movement of the handle from the stowed configuration to the deployed configuration.

16. The computing device of claim 14,
wherein in a fastened state of the fastener, the second axis is perpendicular to the riser card.

17. The computing device of claim 12,
wherein in the stowed configuration, the handle does not protrude above the bracket along a direction of the first axis.

18. The computing device of claim 12,
wherein the bracket comprises a rear portion and a transverse portion, the fastener coupled to the transverse portion, the rear portion forming part of a rear panel of the chassis; and
wherein, in the stowed configuration, the handle extends in a forward direction away from the rear portion.

19. A method, comprising:
positioning a riser cage on a primary system board of a computing device adjacent an expansion slot and a receptacle
connecting an electrical connector of a riser card of the riser cage to the expansion slot, the riser card being electrically connected to an expansion card attached to a bracket of the riser cage;
securing the riser cage to the primary system board by rotating a fastener comprising a shaft, a handle pivotably connected to the shaft, and a half-turn latch connected to the shaft, the rotation of the fastener causing the half-turn latch to engage with the receptacle to secure the fastener to the receptacle; and
pivoting the handle from a deployed configuration to a stowed configuration, wherein in the stowed configuration the handle is parallel to the riser card.

20. The method of claim 19, wherein, in pivoting the handle from the deployed configuration to the stowed configuration, the handle remains parallel to the riser card throughout the pivoting motion.

\* \* \* \* \*